United States Patent [19]

Griswold

[11] Patent Number: 4,748,133
[45] Date of Patent: May 31, 1988

[54] DEPOSITION OF AMORPHOUS SILICON FOR THE FORMATION OF INTERLEVEL DIELECTRICS IN SEMICONDUCTOR MEMORY DEVICES

[75] Inventor: Mark D. Griswold, Chandler, Ariz.
[73] Assignee: Motorola Inc., Schaumburg, Ill.
[21] Appl. No.: 66,672
[22] Filed: Jun. 26, 1987
[51] Int. Cl.[4] .............................................. H01L 29/04
[52] U.S. Cl. ........................................ 437/43; 437/46; 437/161; 357/59
[58] Field of Search ............................ 437/43, 46, 161

[56] References Cited

U.S. PATENT DOCUMENTS

| | | | |
|---|---|---|---|
| 4,370,798 | 2/1983 | Lien et al. | 357/91 |
| 4,420,871 | 12/1983 | Scheibe | 357/59 |
| 4,558,338 | 12/1985 | Sakata | 357/23.9 |
| 4,679,171 | 7/1987 | Logwood et al. | 357/23.9 |

Primary Examiner—Olik Chaudhuri
Attorney, Agent, or Firm—Harry A. Wolin

[57] ABSTRACT

A new and improved method using the deposition of amorphous silicon for the formation of semiconductor memory device interlevel dielectrics. After the deposition of a first polysilicon layer, an amorphous silicon layer is deposited thereon. The polysilicon layer and amorphous silicon layer are etched to form a floating gate. The amorphous silicon layer allows for the growth of thermal oxide layers to take place at lower temperatures thereby decreasing the temperature at which the oxide layers are grown while still repressing the asperity formation. This allows for high quality oxide insulation layers.

13 Claims, 1 Drawing Sheet

DEPOSITION OF AMORPHOUS SILICON FOR THE FORMATION OF INTERLEVEL DIELECTRICS IN SEMICONDUCTOR MEMORY DEVICES

BACKGROUND OF THE INVENTION

This invention generally pertains to the deposition of amorphous silicon for the formation of interlevel dielectrics in semiconductor memory devices. Generally, in semiconductor memory devices such as EEPROMs and EPROMs, it is desirable to insulate polysilicon layers in these multiple polysilicon layer memory structures. To do this, thermal oxide layers are generally grown between polysilicon layers. Commonly, the thermal oxide layers are grown at extremely high temperatures (1100–1150 degrees centigrade) or the oxidation occurs in an oxygen starved environment. This is done so that the asperity formation is greatly reduced. However, high temperature and oxygen starved (diffusion limited oxidation) degrade the tunnel oxide and interlevel oxide respectively. This in turn compromises the endurance and data retention respectively. Therefore, a method which reduces the interlevel oxidation temperature thereby reducing the degradation of the tunnel oxide without compromise to the interlevel oxide is highly desirable.

SUMMARY OF THE INVENTION

The present invention pertains to the deposition of amorphous silicon for the formation of interlevel dielectrics in semiconductor memory devices. After the growth of a first oxide layer and the deposition and doping of a first polysilicon layer, a layer of amorphous silicon is deposited. This amorphous silicon serves many functions. It allows for the growth of interlevel oxide to occur at lower temperatures. In turn, the tunnel oxide layer is not severely degraded in quality. This enables the tunnel oxide to be a high quality insulator. The quality of the tunnel oxide is the major factor in endurance characteristics. Therefore, improvements in the tunnel oxide will result in improved endurance. Additionally, the amorphous silicon is smooth and is not susceptible to asperity formation which degrades the insulator properties of the interlevel oxide. Asperities in turn cause a thinner oxide layer at the points where the polysilicon is irregular. In the present invention, this geometrically enhanced field is repressed.

It is an object of the present invention to provide a new and improved method using the deposition of amorphous silicon for the formation of interlevel dielectrics in semiconductor memory devices which allows for superior insulation quality in the oxide layers.

It is a further object of the present invention to provide a new and improved method using the deposition of amorphous silicon for the formation of interlevel dielectrics in semiconductor memory devices which allows the thermal oxide layers to be grown at relatively low temperature.

It is a further object of the present invention to provide a new and improved method using the deposition of amorphous silicon for the formation of interlevel dielectrics in semiconductor memory devices which represses asperity formation.

It is further object of the present invention to provide a new and improved method using the deposition of amorphous silicon for the formation of interlevel dielectrics in semiconductor memory devices having electrically programmable memories with dual gates.

These and other objects and advantages of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
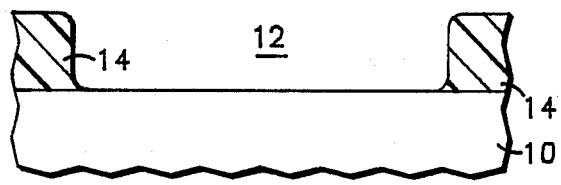
FIG. 1 is enlarged cross-sectional view of an isolated well disposed in a silicon wafer.
Figure 2:
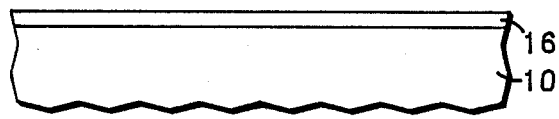
FIGS. 2–8 are highly enlarged cross-sectional views of a semiconductor memory device during various stages of processing.
Figure 3:
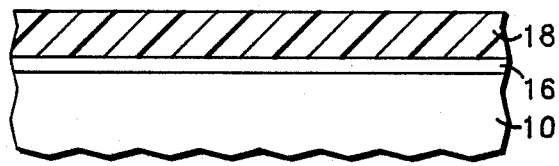
Figure 4:
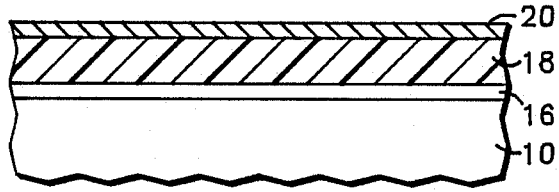
Figure 5:
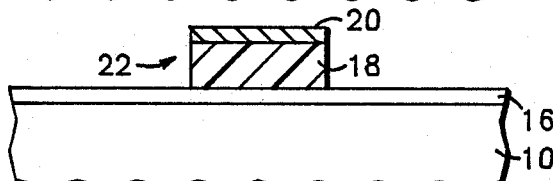
Figure 6:
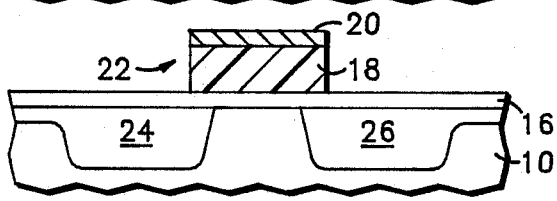
Figure 7:
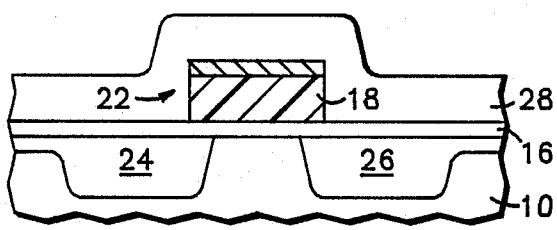
Figure 8:
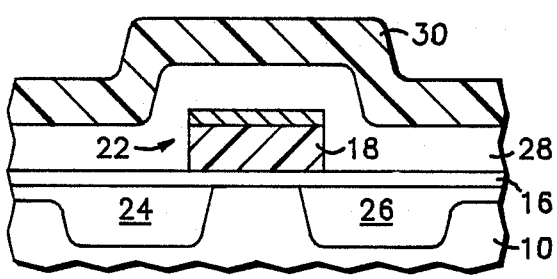

Referring specifically to FIG. 1, an enlarged cross-sectional view of a section of a silicon wafer, 10, is shown. Silicon wafer 10 is shown having a well, 12, which is disposed on silicon wafer 10. Well 12 of silicon wafer 10 is isolated from other areas of silicon wafer 10 by field isolation oxide 14. It should be understood that the following processing steps all occur in well 12 of silicon wafer 10.

Referring specifically to FIGS. 2–8, highly enlarged cross-sectional views are shown of a semiconductor memory device during various stages of processing. Once well 12 (See FIG. 1) is isolated in silicon wafer 10, a first oxide layer 16, is grown on silicon wafer 10. In this embodiment, first oxide layer 16 is 10 nanometers thick. However, it should be understood that first oxide layer 16 may be anywhere from 5 to 15 nanometers thick. Following the growth of first oxide layer 16, a first polysilicon layer, 18, is deposited. Following this deposition, first polysilicon layer 18 is doped. In this embodiment, a phosphorous dopant is used, however it should be understood that many other dopants which are well known in the art may also be employed.

Following the doping of first polysilicon layer 18, an amorphous silicon layer, 20, is deposited. In a semiconductor memory device such as an EEPROM or an EPROM, it is important that the oxide layers be of extremely high quality. If they are not, the result will be extremely poor data retention characteristics. Amorphous silicon layer 20 serves to seal first polysilicon layer 18. Additionally, amorphous silicon layer 20 is smooth relative to first polysilicon layer 18. The smoothness of amorphous silicon layer 20 allows for the oxide layers to be grown at a much lower temperature. While these oxide layers are being grown, amorphous silicon layer 20 seals the dopant into first polysilicon layer 18 so that it cannot escape and cause autodoping problems. Amorphous silicon layer 20 also suppresses asperity formation at the reduced temperature. Asperity formation causes protrusions into the oxide layers which cause a non-uniform current flow throughout the oxide layers. This degradation of the oxide layers causes poor data retention characteristics. Amorphous silicon layer 20 represses the asperity formation thereby allowing for improved data retention in the semiconductor device while improving the endurance at the same time.

Once amorphous silicon layer 20 is deposited, amorphous silicon layer 20, first polysilicon layer 18 and first oxide layer 16 are etched to form a floating gate, 22. The etching of floating gate 22 is performed by using methods which are well known in the art. Following the formation of floating gate 22, a source, 24, and a drain, 26, are implanted. In this embodiment, a self-aligned implant is employed which uses floating gate 22 as a mask. Using this technique, no separate mask is needed. However, it should be understood that other methods well known in the art may be used to implant source 24 and drain 26. Following the implantation of source 24 and drain 26, a second oxide layer, 28, is grown. Second oxide layer 28 serves as an interlevel dielectric. In this embodiment, second oxide layer 28 has a thickness of 40 nanometers. However, second oxide layer 28 may have a thickness anywhere in the range of 30 to 50 nanometers. Again, due to amorphous silicon layer 20, the growth of second oxide layer 28 may occur at a relatively low temperature. In this embodiment, second oxide layer 28 is grown at a temperature in the range of 1000 to 1050 degrees centigrade. It should be understood, however, that second oxide layer 28 may be grown anywhere in the range of 950 to 1100 degrees centigrade. Those skilled in the art will recognize that amorphous silicon layer 20 will crystallize at this temperature and becomes virtually indistinguishable from first polysilicon layer 18.

Following the growth of second oxide layer 28, a second polysilicon layer, 30, is deposited. Again, second polysilicon layer 30 is doped, in this case using a phosphorous dopant although other dopants which are well known in the art may be used. Following the doping of second polysilicon layer 30, second polysilicon layer 30 is defined and etched in predetermined manner using methods well known in the art. The resultant device is semiconductor memory device 32.

Thus it is apparent that there has been provided, in accordance with the invention, an improved method using the deposition of amorphous silicon for the formation of interlevel dielectrics in semiconductor memory devices which meets the objects and advantages set forth above. While specific embodiments of this invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

I claim:

1. Method of making a semiconductor memory device comprising the steps of:
   providing a silicon wafer;
   isolating an area on said silicon wafer and defining a well thereon;
   growing a first oxide layer on said well;
   depositing a first polysilicon layer on said silicon wafer including said well and said first oxide layer;
   doping said first polysilicon layer;
   depositing an amorphous silicon layer on said doped polysilicon layer;
   defining and etching said first oxide layer, said doped polysilicon layer and said amorphous silicon layer to form a floating gate in said well;
   implanting a source and a drain;
   growing a second oxide layer on said well including said floating gate;
   depositing a second polysilicon layer on said second oxide layer;
   doping said second polysilicon layer; and
   defining and etching said doped second layer.

2. The method of claim 1 wherein the growing a first oxide layer step includes growing a first oxide layer having a thickness of 10 nanometers.

3. The method of claim 1 wherein the growing a first oxide layer step includes growing a first oxide layer having a thickness in the range of 5 to 15 nanometers.

4. The method of claim 1 wherein the growing a second oxide layer step includes growing a second oxide layer having a thickness of 40 nanometers.

5. The method of claim 1 wherein the growing a second oxide layer step includes growing a second oxide layer having a thickness in the range of 30 to 50 nanometers.

6. The method of claim 1 wherein the growing a second oxide layer step is performed at a temperature in the range of 1000 to 1050 degrees centigrade.

7. The method of claim 1 wherein the growing a second oxide layer step is performed at a temperature in the range of 950 to 1100 degrees centigrade.

8. The method of claim 1 wherein the steps of doping the first and second polysilicon layers include using a phosphorous dopant.

9. The method of claim 1 wherein the implanting step includes using a self-aligned implant.

10. The method of claim 1 wherein said method is performed a multiple number of times in a single silicon wafer.

11. A method of making a semiconductor memory device comprising the steps of:
    providing a silicon wafer;
    isolating an area on said silicon wafer to provide a well;
    growing a first oxide layer on said well, said first oxide layer having a thickness in the range of 5 to 15 nanometers;
    depositing a first polysilicon layer on said silicon wafer including said well and said first oxide layer;
    doping said first polysilicon layer using a phosphorous dopant;
    depositing an amorphous silicon layer on said doped first polysilicon layer;
    defining and etching said doped first polysilicon layer and said amorphous silicon layer to form a floating gate in said well;
    implanting a source and a drain using a self-aligned implant;
    growing a second oxide layer on said well including said floating gate, said second oxide layer having a thickness in the range of 30 to 50 nanometers;
    depositing a second polysilicon layer on said second oxide layer;
    doping said second polysilicon layer using a phosphorous dopant; and
    defining and etching said doped second polysilicon layer.

12. The method of claim 11 wherein said method is performed a multiple number of times on a single wafer.

13. A method of making a semiconductor memory device having an interlevel dielectric wherein a first oxide layer is grown on a silicon wafer, a polysilicon layer is formed on said first oxide layer, an amorphous silicon layer is formed on said first polysilicon layer and a second oxide layer is grown on said amorphous silicon layer, said second oxide layer providing said interlevel dielectric.

* * * * *